US007848222B2

United States Patent
Wang et al.

(10) Patent No.: US 7,848,222 B2
(45) Date of Patent: Dec. 7, 2010

(54) PULSED WAVE INTERCONNECT

(75) Inventors: Pingshan Wang, Central, SC (US); Edwin C. Kan, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 1193 days.

(21) Appl. No.: 11/411,228

(22) Filed: Apr. 26, 2006

(65) Prior Publication Data

US 2008/0219293 A1 Sep. 11, 2008

Related U.S. Application Data

(60) Provisional application No. 60/675,090, filed on Apr. 27, 2005.

(51) Int. Cl.
*H04J 7/00* (2006.01)
(52) U.S. Cl. .................... 370/212; 370/498; 333/20; 326/41
(58) Field of Classification Search ............. 370/498, 370/212, 213, 243, 263; 333/12, 20, 24, 333/24.1, 24.2, 24.3, 26, 34; 326/41
See application file for complete search history.

(56) References Cited

U.S. PATENT DOCUMENTS

| | | | | |
|---|---|---|---|---|
| 5,313,398 A | * | 5/1994 | Rohrer et al. ................ | 703/14 |
| 5,663,890 A | * | 9/1997 | Saleh et al. ................... | 703/4 |
| 5,789,994 A | * | 8/1998 | Case et al. .................... | 333/20 |
| 6,023,360 A | * | 2/2000 | Morioka et al. ............... | 398/1 |
| 6,366,127 B1 | * | 4/2002 | Friedman et al. ............. | 326/83 |
| 6,538,525 B1 | * | 3/2003 | Williamson .................. | 333/20 |
| 6,826,208 B1 | * | 11/2004 | Birk ............................ | 372/25 |
| 7,363,018 B2 | * | 4/2008 | Tyrrell et al. ................ | 455/313 |

OTHER PUBLICATIONS

Pingshan Wang; Pei, G.; Kan, E.C.-C.; Very Large Scale Integration (VLSI) Systems, IEEE Transactions on vol. 12, Issue 5, May 2004 pp. 453-463 Digital Object Identifier 10.1109/TVLSI.2004.826196.*

* cited by examiner

*Primary Examiner*—Ricky Ngo
*Assistant Examiner*—Gary Mui
(74) *Attorney, Agent, or Firm*—Jones, Tullar & Cooper, P.C.

(57) ABSTRACT

A method for transmitting signals along an interconnect in a VLSI system comprising receivers is disclosed. The VLSI based systems operate in the high Giga hertz range. The signals are transmitted along the interconnect as a localized wave packet i.e. as a pulse. The interconnect may be either electrically linear or nonlinear in nature.

20 Claims, 5 Drawing Sheets

(a)

(b)

(c)

(a)

(b)

(c)

(a)

(b)

(a)

(b)

PULSED WAVE INTERCONNECT

CROSS REFERENCE TO RELATED APPLICATIONS

The present application claims priority under 35 U.S.C §119(e) of U.S. Provisional application 60/675,090 filed Apr. 27, 2005, the entire contents of which are hereby incorporated by reference.

GOVERNMENT SPONSORSHIP STATEMENT

This invention was made with Government support from the Defense Advanced Research Projects Agency (DARPA) under grant number F30602-01-2-0552 and the National Science Foundation (NSF) under grant number 9985062. The Government has certain rights in the invention.

BACKGROUND OF THE INVENTION

1. Field of the Invention

Systems and methods for on-chip interconnect are disclosed. More specifically, systems and methods are described for transmission of signals as localized wave packets that propagate along the interconnect lines to trigger the receivers. In addition, the present invention enables time division multiplexing of signals on a single interconnect.

2. Description of the Background Art

On-Chip global interconnect is among the top challenges in integrated circuit technology scaling due to the rapidly increasing operation frequencies and the growing chip size. With clock frequencies in multi gigahertz range, inductance, capacitance and other frequency dependant factors have to be taken into consideration. For high frequency range, frequency related dispersions and skin effect are other concerns while designing interconnects. Other global interconnects, such as data bus and control lines, face similar complications.

In interconnect design, the general practice in transmitting signals is to control the voltage level of the entire interconnect line and connected receivers. As a result, the long line and all the receivers are very heavy loads to the drivers. Repeaters are thus needed to overcome the propagation delay. This however adds more chip area and increases the power consumption of the system.

SUMMARY OF THE INVENTION

A method for transmitting signals along an interconnect in a VLSI system comprising receivers is disclosed. The VLSI based systems operate in the high Giga hertz range. The signal is transmitted along the interconnect as a localized wave packet i.e. as a pulse. The interconnect may be either electrically linear or nonlinear in nature.

BRIEF DESCRIPTION OF THE DRAWINGS

FIG. 2(a). Dotted line: input signal; dashed line: output signal from the circuit in FIG. 1(a). Solid line: output of the circuit in FIG. 1(b).

FIG. 2(b). Two pulses sharing one interconnect. Dotted line: input signal to the inverter 2 in FIG. 1(a). Dashed line: output signal from the receiver in FIG. 1(a). Inter symbol interferences exist, but reach steady state after several periods.

DETAILED DESCRIPTION OF THE INVENTION

Overview

Figure 1:
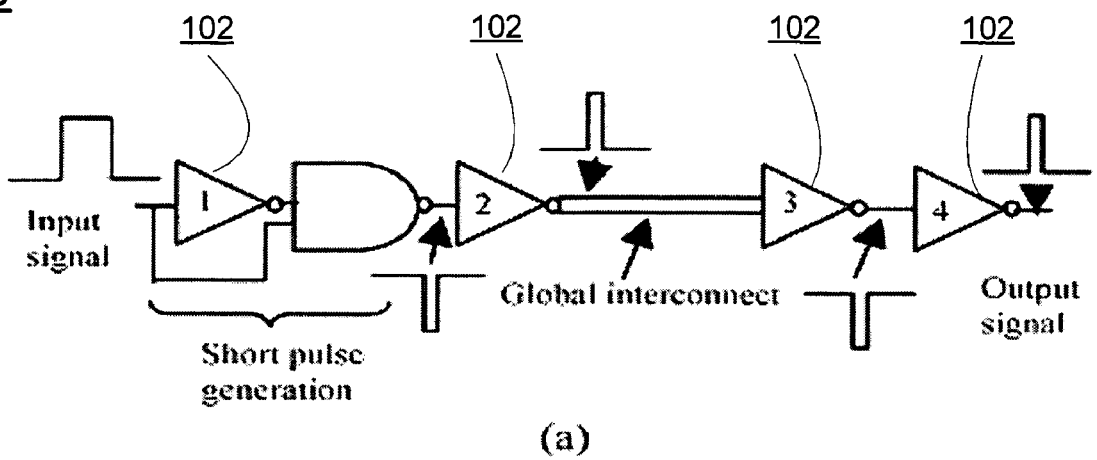
FIG. 1(a) depicts a general pulsed wave interconnect circuit logic as disclosed herein.
FIG. 1(b) shows an equivalent circuit of the logic in FIG. 1(a).
FIG. 1(c) shows a conventional circuit with repeaters inserted. The line is uniformly divided into "n" sections. Each driver is 'h' times of the minimum size inverter.
Figure 1:
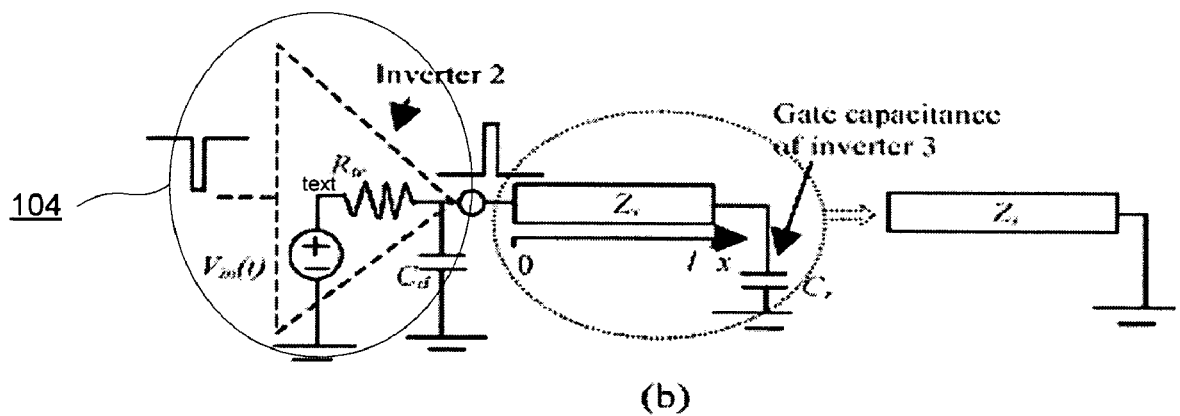
Figure 1:
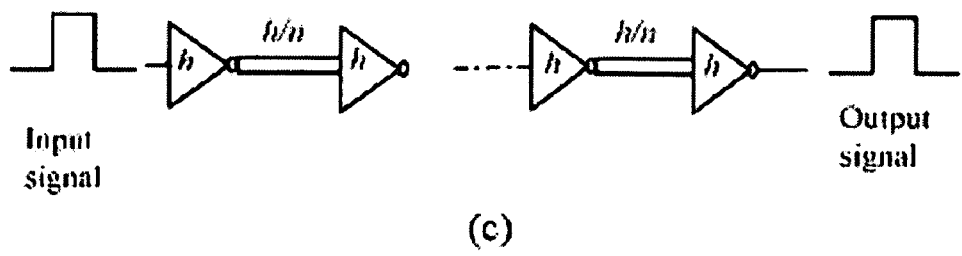

Methods and systems for realizing on-chip interconnect are disclosed. In typical VLSI based systems, a new interconnect scheme can be realized when the clock frequency ($f_{clock}$) is pushed into the high-gigahertz range. In such systems, a localized wave packet i.e. a pulse with a width of only a small fraction of the global clock signal ($T_c$) is required to trigger a receiver. The pulse is also spatially short in comparison with the chip size in the conventional technologies. If such a pulse is used as a signal carrier, the long interconnect would electrically isolate the driver from the receiver. Such a practice of charging up the entire line and the receivers, results in waste of energy and resources in high-speed VLSI systems. Therefore in such systems, only a short pulse with duration of a small fraction of $T_c$ is necessary and sufficient for signal transmission and for triggering the receiver.

This approach is annotated as Pulsed Wave Interconnect wherein only a small part of the interconnect line is charged for signal transmission. In one embodiment, the same interconnect line is shared by several consecutive time division multiplexed pulses to boost the bit-rate capacity of the interconnect lines.

In another embodiment, where the attenuation of the pulses is very high, a non-linear transmission line is used to counter waveform distortion and amplitude loss. The pulse propagation along these interconnects results in the pulse being propagated as solitons.

The aspects involved in realizing a Pulsed Wave Interconnect are now described in greater detail.

An Exemplary System

Although not required, the systems and methods for realizing pulsed wave interconnect are described in the general context of logic circuitry and active and passive electronic elements. While the systems and methods are described in the foregoing context, acts and operations described hereinafter may also be implemented as hardware.

FIG. 1(a) depicts an exemplary pulsed wave circuit 100 through the use of logic circuits in one implementation. An equivalent circuit of FIG. (1a) is depicted in FIG. 1(b). The pulsed wave circuit as depicted in FIG. 1(a) consists of inverters 102-1, 102-2, 102-3 and 102-4.

It would be appreciated that all the components of the pulsed wave circuit are connected to each other through an interconnect. Another embodiment the system includes one or more receivers, with the receivers being identical or non-identical or a combination thereof. In such systems, a pulse with a width of only a small fraction of the global clock signal ($T_c$) would be necessary and sufficient to trigger the receiver. The pulse is also spatially short in comparison with the chip size known in conventional technologies. When such a pulse is used as a signal carrier, the long interconnect would electrically isolate the driver from the receiver. It also results in the system consuming lesser amount of energy as compared to existing interconnect methodologies. FIG. 1(c) shows a conventional circuit with repeaters, wherein the interconnect is uniformly divided into "n" sections. Each driver is 'h' times of the minimum size inverter. The detailed analysis of the energy consumption of the two systems is provided in the section titled "ENERGY CONSUMPTION IN PULSED WAVE INTERCONNECT SYSTEMS".

In case of severe signal dispersion and attenuation, nonlinearity can be introduced to counter wave form distortion and amplitude loss. In another embodiment, this is achieved by using a Non-Linear Transmission Line (NLTL). The pulse propagation along such interconnects results in the pulse being propagated as a soliton. A soliton is a self-reinforcing solitary wave caused by nonlinear effects in the medium through which it propagates. Solitons are found in many physical phenomena. They arise as the solutions of a widespread class of weakly nonlinear partial differential equations describing physical systems. An NLTL is a type of transmission line which is periodically loaded with nonlinear energy storage elements in stages. In one implementation the NLTL uses nonlinear capacitors. The analysis of the transmission of a pulse over a non-linear interconnect is described in the section titled "NONLINEAR TRANSMISSION LINE (NLTL) DESIGN".

In accordance with the invention, a small portion of the entire line would be charged. Smaller line capacitances and the voltage doubling property of the receiver gate capacitances help reduce energy consumption. It is also evident from the invention that an NLTL may also be used to overcome pulse broadening and attenuation caused by dispersion and frequency-dependant losses.

Energy Consumption in Pulsed Wave Interconnect Systems

FIG. 1(a) illustrates an arrangement of the proposed pulsed wave interconnect for signal transmission which can be represented by a line with R, L, C, G as its resistance, inductance, capacitance and conductance per unit length respectively. To simplify the analysis in this section, a linear, non-dispersive line is assumed with DC attenuations. The input pulse duration is of the order of $T_c$ and much longer than the fan-out-of-4 (FO4) $T_{FO4}$. A sub-circuit is used to generate a short pulse with a duration determined by the propagation delay of inverter 102-1. Inverter 102-2 then generates a short electrical pulse through charging up the interconnect line. If the round-trip time-of-flight of the line is longer than the pulse duration $T_p$, the receiver inverter is electrically isolated from the driver. The load of the pull-up pMOS transistor is equivalent to an infinitely long transmission line, which can be represented as a grounded load with an impedance equal to the line characteristic impedance $Z_s$ given by:

$$Z_s = \sqrt{(R + j\omega L)/(G + j\omega C)}$$
$$= Z_0 \sqrt{(1 + (R/j\omega L)/(1 + (G/j\omega C))}$$

where $Z_0$ is the lossless characteristic impedance of the line and is given as $Z_0 = \sqrt{L/C}$ The pMOS transistor (inverter 2) 104 as indicated in FIG. 1(b) is assumed to be operating in the linear region. The expression for the voltage wave front V(x) traveling down the lossy infinite line is given by:

$$V(x) = V_{dd} \frac{Z_0}{Z_0 + R_{tr}} e^{-Rx/(2Z_0)}$$

where $V_{dd}$ is the power source voltage; $R_{tr}$ is the equivalent source resistance; and Rx is the line characteristic impedance at point x.

It is known in the art that the significant frequency given by:

$$f = \frac{0.34}{t_r}$$

where $t_r$ is the signal rise time.

The above equation provides a very good representative frequency of a trapezoidal pulse for approximating its high-frequency electrical behavior.

The pulsed wave interconnect method requires a pulse at the end of the interconnect line with amplitude given by:

$$V(l) = \frac{V_{dd} Z_0}{Z_0 + R_{tr}} e^{-Rl/2Z_0} > \frac{V_M}{2}$$

Wherein V(l)=V(x) for x=l.

The pulse takes a length $L_p$ along the interconnect line where $L_p$ is given as:

$$L_p = T_p \times v_p$$

where $v_p$ is the signal transmission speed determined by the speed of light in the dielectric medium.

The interconnect capacitance, which is effectively charged up to generate a certain voltage across the length of the interconnect is given by $C_p$. In one cycle of charging and discharging, the energy consumption related to $C_p$ is given by the equation:

$$E_{pl} = C_p \left(\frac{Z_0}{Z_0 + R_{tr}}\right)^2 V_{dd}^2.$$

The energy consumed by charging and discharging the capacitors of the drivers and the receivers in one cycle can be approximated by the following expression.

$$E_{pdr} = C_{pdr} V_{dd}^2$$

where $C_{pdr}$ is the sum of all the input and output capacitances in FIG. 1(a). It should be noted that the sub-script p denotes the variables in the Pulsed Wave Interconnect systems, The system and methods use lesser amount of energy and space as compared to conventional repeater insertion methods. A conventional repeater insertion circuit is indicated in FIG. 1(c). In this system, the energy consumption by the whole line whose capacitance is $C_l$ is represented as:

$$E_l = C_l V_{dd}^2$$

The energy consumption of the systems using repeaters is represented by $$E_{rdr} = C_{rdr} V_{dd}^2$$

Where $C_{rdr}$ is the sum of all input and output capacitances of the repeaters.

It should be noted that the sub-script r denotes the systems using repeater insertion.

The total energy consumed in the pulsed wave interconnect and repeater insertion methods are given by:

$$E_p = E_{pl} + E_{sdr}$$
$$= \left( C_p \left( \frac{Z_0}{Z_0 + R_{tr}} \right)^2 + C_{sdr} \right) V_{dd}^2$$
$$E_{repeater} = E_l + E_{rdr} = (C_l + C_{rdr}) V_{dd}^2.$$

The circuits were simulated on SPICE and the results obtained are tabulated in Table I. Table I lists the energy consumption, propagation delay and layout area for driving a line of length 10 cm with Zo=75 Ω, L=500 nH/m, C=89 pF/m, and R=1500 Ω/m using FIGS. 1(a) and (c).

TABLE 1

ENERGY CONSUMPTION, AREA AND THE PROPOGATION DELAY FOR THE INTERCONNECT IN FIG. 1.

| | Energy | | Delay | $I_{max}$ | |
|---|---|---|---|---|---|
| | Calculations (pJ) | Simulated[2] (pJ) | Simulated[2] (ps) | Simulated[2] (mA) | Area[1] Simulated[2] |
| Pulsed Wave Interconnect | ~11.4 | 13.4 | ~840 | ~15 | ~316 |
| Repeater Insertion | ~23 | 32 | 840 | ~14 | ~500 |

[1]Areas are in minimum size inverter
[2]Simulated indicates results from the SPICE simulations Table I indicates that the pulsed wave interconnect, as in one of the embodiments, is superior to the repeater insertion method on energy consumption (saves more than 50%) and layout area (saves about 30%) when the signal propagation delays are about the same. Pulsed wave interconnect uses about the same peak current as the repeater insertion method. In the simulation, the last inverters in both circuits are chosen to be the same so that they will have identical driving ability to the following stages. The requirement for the input signal is also set approximately the same to make the comparison fair.

In one implementation the pulsed wave of ~200 ps duration, which is about 3 times of $t_{FO4}$ and 3 cm long on the line, has an amplitude of about 1.22 V at the driver end under $V_{dd}$ equal to 1.8 V.

Figure 2:
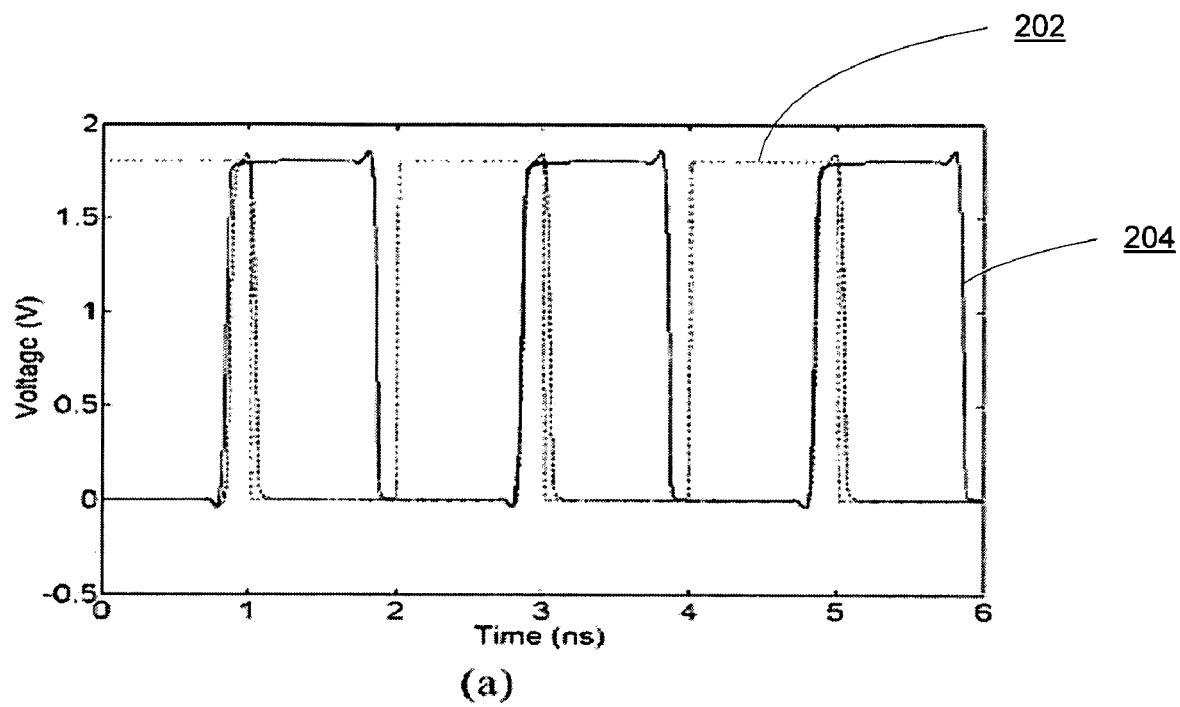
FIG. 2 shows waveforms from SPICE simulations.
Figure 2:
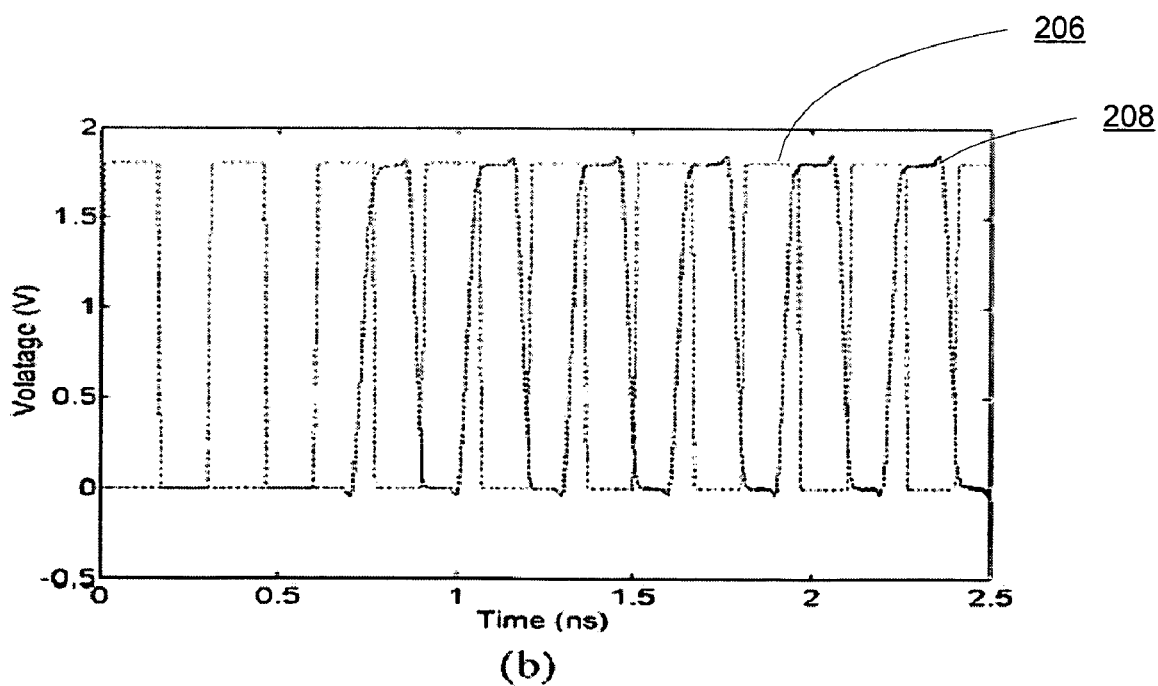

FIG. 2(b) shows another embodiment in which the same line can be shared by two short pulses simultaneously with minimal inter symbol interference. The above embodiments show that pulsed wave interconnect can be used for wafer-scale integration or packaging interconnect to save energy and area.

Nonlinear Transmission Line (NLTL) Design

Figure 3:
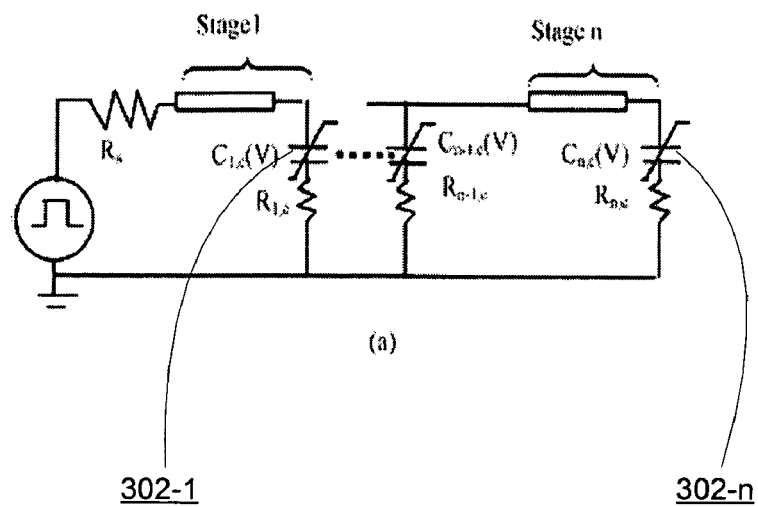
FIG. 3(a) Non Linear Transmission Line (NLTL) with nonlinear capacitors.
FIG. 3(b) Simplified equivalent circuits which are conventionally used for soliton studies.
Figure 3:
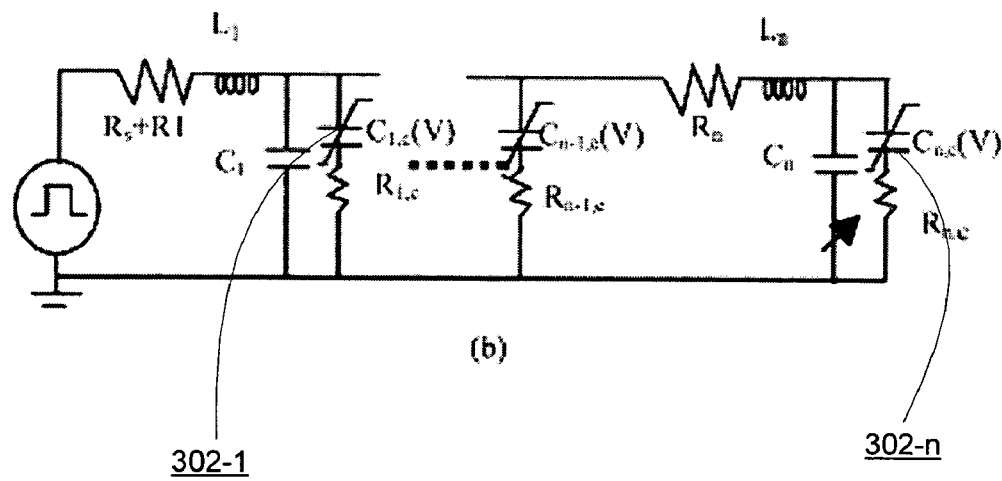

An NLTL is a type of transmission line which is periodically loaded with nonlinear energy storage elements in stages. In one implementation, the NLTL uses nonlinear capacitors 302-1 to 302-n. Such a circuit 300-1 and the corresponding equivalent circuit 300-2 are shown in FIG. 3.

Figure 4:
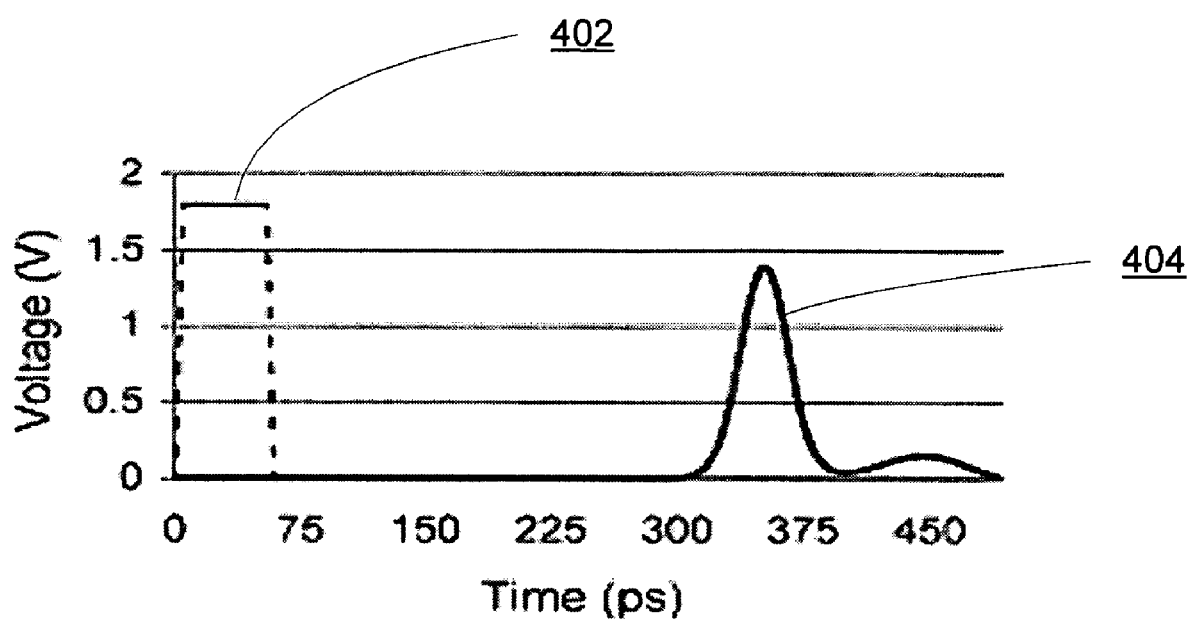
FIG. 4 represents Pulse-shaped soliton generated using models of FIG. 3(a) with 100 lumped RLC elements for each stage: Dashed line: input; solid line: output.

FIG. 4 shows the pulse-shaped soliton 404 generated by the input signal 402 and transmitted with hundred lumped RLC elements for each stage in another embodiment.

Figure 5:
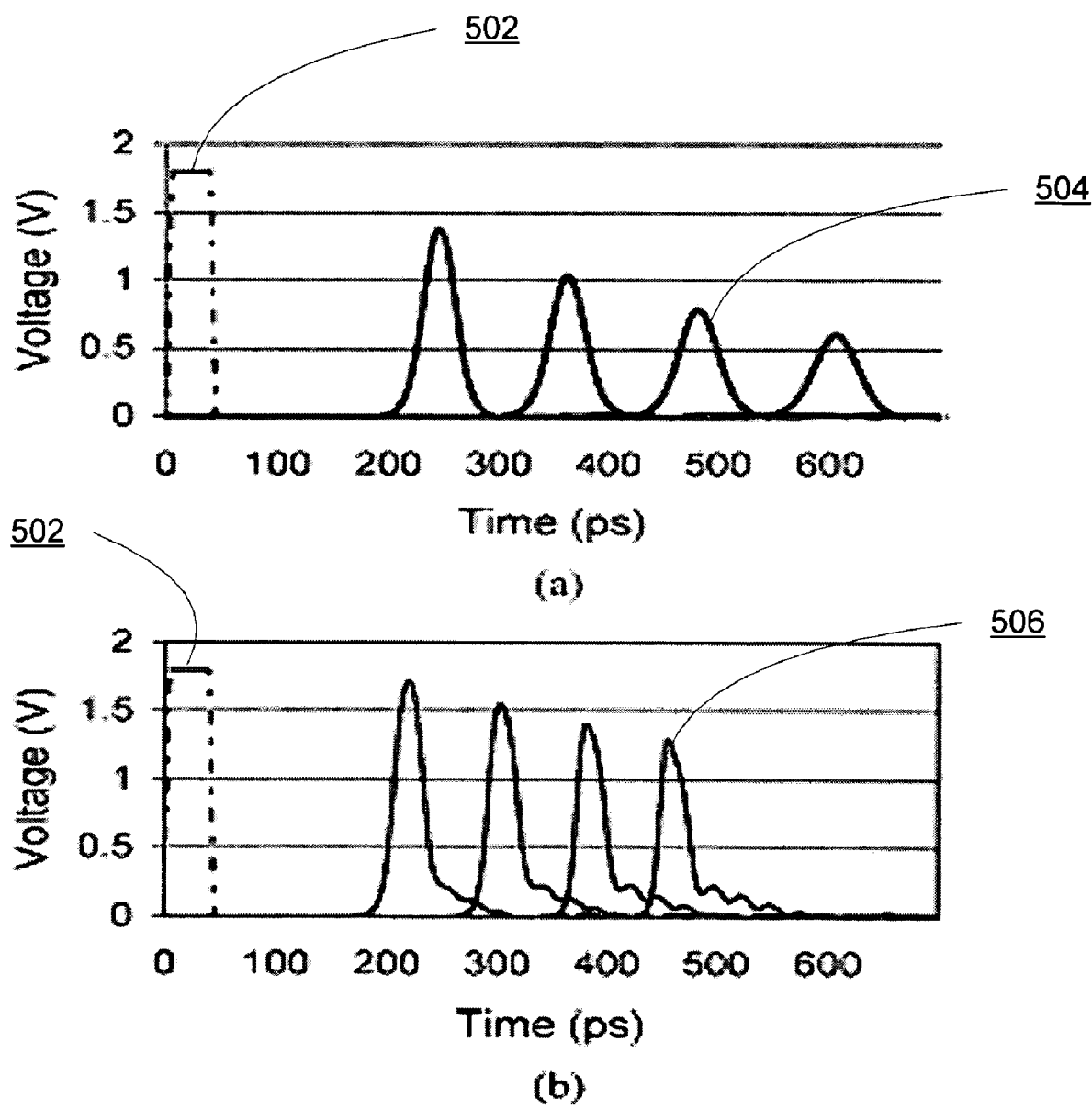
FIG. 5(a) Pulse amplitude attenuation during propagation through the NLTL. Dashed line: input; solid lines: outputs at different stages.
FIG. 5(b) Pulse compression for amplitude amplification. The line parameters are similar to the line in FIG. 4. The symbols are similar to those in FIG. 5(a).

FIG. 5(a) shows a pulsed wave 504 generated by the input signal 502 and propagating through the NLTL, without pulse compression. As shown in FIG. 5(a), the soliton amplitude will gradually diminish because of the losses from the resistances in the interconnect. Pulse compression can be used to compensate for the amplitude loss. In one embodiment, pulse compression shown in FIG. 5(b), is obtained by tapering the non-linear energy storage elements. The tapering is applied at each stage along the length of the interconnect. The non-linear capacitance is given by the following equation:

$$C_{n,c}(V) = k^n C_{d0}/(1 + V/V_{cc})$$

where k is the tapering factor, for the stage n. The choice of the value of the tapering factor k is dependent on the expected pulse width, amplitude and the number of stages. It may be noted that the pulse amplitude attenuation in 5(b) is far less than in FIG. 5(a).

The pulse amplitude attenuation of the pulse 506, along NLTL which is tapered is dramatically reduced. In the case of the last pulse in FIG. 5(b), the pulse amplitude is about two times that of the last pulse in FIG. 5(a). In one implementation of the tapered NLTL, the capacitors used have a tapering factor of 0.95.

CONCLUSION

In accordance with the method disclosed, a small portion of the entire line would be charged. Smaller line capacitances and voltage doubling property of the receiver gate capacitances help reduce energy consumption. It is also evident that an NLTL may be used to overcome pulse broadening and attenuation caused by dispersion and frequency-dependant losses.

Although the foregoing description has been shown and described with reference to particular embodiments and applications thereof, it may be appreciated that the embodiments and implementations have been presented for purposes of illustration and description and is not intended to be exhaustive or to limit the invention to the particular embodiments and implementations disclosed. It will be apparent to those ordinarily skilled in the art that a number of changes, modifications, variations or alterations to the systems and methods as described herein may be made, none of which depart from the spirit or scope of the invention.

We claim:

1. A method of transmitting a signal in a VLSI system comprising receivers, said method comprising transmitting the signal along an electrically non-linear interconnect as a localized wave packet, said localized wave packet having a spatial length that is shorter than a length of said interconnect; whereby, only a portion of said interconnect is electrically charged as said localized wave packet is transmitted along said interconnect.

2. The method of claim 1, wherein said VLSI system includes a gigahertz global clock and the spatial length of the localized wave packet is shorter than the period of the global clock.

3. The method as claimed in claim 2, wherein the global clock has a frequency of the order of $10^9$ to $10^{12}$ Hz.

4. The method of claim 1, wherein the receivers are not identical.

5. The method of claim 1, wherein a plurality of signals are transmitted sequentially along said interconnect, each of said signals being transmitted as a corresponding one of a plurality of sequential localized wave packets, each of which has a spatial length that is shorter than the length of said interconnect.

6. The method of claim 1, wherein the interconnect is a transmission line with non-linear energy storage elements distributed along the length of the interconnect.

7. The method as claimed in claim 1, further comprising compression of the wave packet by tapering the interconnect with a pre-determined tapering factor.

8. The method as claimed in claim 7, wherein the tapering factor is between 0.92 and 0.98.

9. A method of transmitting a signal in a VLSI system comprising receivers, said method comprising transmitting the signal along an electrically linear interconnect as a localized wave packet, said localized wave packet having a spatial length that is shorter than a length of said interconnect; whereby, only a portion of said interconnect is electrically charged as said localized wave packet is transmitted along said interconnect.

10. The method of claim 9, wherein said VLSI system includes a gigahertz global clock and the spatial length of the localized wave packet is shorter than the period of the global clock.

11. The method as claimed in claim 10, wherein the global clock has a frequency of the order of $10^9$ to $10^{12}$ Hz.

12. The method of claim 9, wherein the receivers are not identical.

13. The method of claim 9, wherein a plurality of signals are transmitted sequentially along said interconnect, each of said signals being transmitted as a corresponding one of a plurality of sequential localized wave packets, each of which has a spatial length that is shorter than the length of said interconnect.

14. A VLSI based system comprising, a transmitter module, one or more receivers and an interconnect, wherein the transmitter sends a signal to one or more receivers as a localized wave packet over the interconnect, said localized wave packet having a spatial length that is shorter than a length of said interconnect; whereby, only a portion of said interconnect is electrically charged as said localized wave packet is transmitted along said interconnect.

15. The system of claim 14, wherein the interconnect has non-linear electrical characteristics.

16. The system as claimed in claim 15, wherein the interconnect is a transmission line periodically loaded with non-linear energy storage components.

17. The system as claimed in claim 15, wherein compression of the wave packets is achieved by tapering the interconnect with a pre-determined tapering factor.

18. The system as claimed in claim 17, wherein the pre-determined tapering factor is between 0.92 and 0.98.

19. The system of claim 14, wherein a plurality of signals are transmitted along said interconnect, each of said signals being transmitted as a corresponding one of a plurality of spaced localized wave packets, each of which has a spatial length that is shorter than the length of said interconnect.

20. The system as claimed in claim 14, further including a gigahertz global clock having a frequency of the order of $10^9$ to $10^{12}$ Hz, and wherein the spatial length of the localized wave packet is shorter than the period of the global clock.

* * * * *